US007916153B1

(12) United States Patent
Lew et al.

(10) Patent No.: US 7,916,153 B1
(45) Date of Patent: Mar. 29, 2011

(54) BACKLIGHT DIMMING AND LCD AMPLITUDE BOOST

(75) Inventors: Stephen D. Lew, Sunnyvale, CA (US); Michael A. Ogrinc, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 748 days.

(21) Appl. No.: 11/955,276

(22) Filed: Dec. 12, 2007

Related U.S. Application Data

(62) Division of application No. 11/619,160, filed on Jan. 2, 2007, which is a division of application No. 10/316,521, filed on Dec. 11, 2002, now Pat. No. 7,176,878.

(51) Int. Cl.

| | |
|---|---|
| ***G09G 5/00*** | (2006.01) |
| ***G09G 5/10*** | (2006.01) |
| ***G09G 3/34*** | (2006.01) |
| ***G09G 3/36*** | (2006.01) |
| ***H04N 5/46*** | (2006.01) |
| ***H04N 5/57*** | (2006.01) |
| ***G03F 3/08*** | (2006.01) |

(52) U.S. Cl. ........ 345/589; 345/102; 345/545; 345/591; 345/690; 348/557; 348/560; 348/687; 348/708; 358/518; 358/519; 358/523

(58) Field of Classification Search .................. 345/418, 345/581, 589–591, 600, 604, 545–547, 530, 345/549, 204, 690, 207, 211, 102, 22; 348/461, 348/467, 469, 496, 488, 514, 519–520, 557, 348/560, 602–603, 687–708; 358/515–520
See application file for complete search history.

(56) References Cited

U.S. PATENT DOCUMENTS

| | | | | |
|---|---|---|---|---|
| 4,873,516 A | | 10/1989 | Castleberry | |
| 4,998,045 A | | 3/1991 | Ruby | |
| 5,526,050 A | * | 6/1996 | King et al. | 348/386.1 |
| 5,646,702 A | | 7/1997 | Akinwande et al. | |
| 5,903,261 A | * | 5/1999 | Walsh et al. | 715/201 |
| 6,452,582 B1 | | 9/2002 | Rolston | |
| 6,621,482 B2 | | 9/2003 | Fuller | |
| 6,654,082 B1 | | 11/2003 | Sohda et al. | |
| 6,801,220 B2 | | 10/2004 | Greier et al. | |
| 6,841,947 B2 | | 1/2005 | Berg-Johansen | |
| 7,002,546 B1 | | 2/2006 | Stuppi et al. | |

(Continued)

OTHER PUBLICATIONS

Office Action, U.S. Appl. No. 11/619,160, dated Sep. 21, 2009.

(Continued)

*Primary Examiner* — Wesner Sajous
(74) *Attorney, Agent, or Firm* — Patterson & Sheridan, LLP.

(57) ABSTRACT

Embodiments of the present invention generally provide m Methods and apparatus for reducing power consumption of backlit displays are described. Power consumption is reduced by dimming backlighting by a first scale factor and boosting pixel values by a second scale factor to compensate for the dimming. The scale factors may be constant values. Alternately, one or both of the scale factors may be determined based on pixel values for one or more frames to be displayed and/or one or more frames that have been displayed. For example, scale factors may be calculated based on an average linear amplitude of one or more frames of pixel values or from a maximum pixel value of one or more frames of pixel values. A graphical processing system is described including an integrated circuit capable of transforming a pixel value from a gamma-compensated space to a linear space.

12 Claims, 11 Drawing Sheets

U.S. PATENT DOCUMENTS 7,154,468 B2 12/2006 Linzmeier et al.
7,176,878 B2 2/2007 Lew et al.
7,327,866 B2 2/2008 Bae et al.
7,573,457 B2 8/2009 Daly
7,729,510 B2 6/2010 Zakrzewski et al.
2001/0033260 A1 10/2001 Nishitani et al.
2002/0085155 A1* 7/2002 Arikawa ....................... 349/129
2002/0180687 A1 12/2002 Webber
2003/0001815 A1 1/2003 Cui
2003/0161531 A1 8/2003 De Grandi
2004/0113906 A1 6/2004 Lew et al.
2005/0110740 A1 5/2005 Linzmeier et al.
2005/0122287 A1 6/2005 Nishitani et al.
2005/0128352 A1* 6/2005 Gryskiewicz ................. 348/554
2005/0156871 A1 7/2005 Ikeda
2009/0073108 A1 3/2009 Gorog

OTHER PUBLICATIONS

Office Action dated Aug. 6, 2010. U.S. Appl. No. 11/957,356.
Office Action, U.S. Appl. No. 11/619,160 dtd. Sep. 13, 2010.
Office Action, U.S. Appl. No. 11/955,271 dtd. Sep. 15, 2010.
Office Action, U.S. Appl. No. 11/957,356 dtd. Dec. 1, 2010.

* cited by examiner

BACKLIGHT DIMMING AND LCD AMPLITUDE BOOST

CROSS-REFERENCE TO RELATED APPLICATIONS

This application is a divisional of U.S. patent application Ser. No. 11/619,160, filed Jan. 2, 2007, which is a divisional of U.S. patent application Ser. No. 10/316,521, filed Dec. 11, 2002, issued as U.S. Pat. No. 7,176,878 on Feb. 13, 2007.

BACKGROUND

1. Field of the Invention

One or more aspects of the present invention generally relate to backlit displays and, more particularly, to reducing power consumption of backlit displays by reducing an amount of backlighting.

2. Description of the Related Art

Liquid crystal display (LCD) screens used in notebook computers are commonly backlit to make them easier to read. FIG. 1 illustrates an exemplary backlit liquid crystal display (LCD) 100 that includes a core of LCD material 102 between sheets of glass 104 and 106. A backlighting element 108 produces light to illuminate LCD material 102. As illustrated by the arrows, light produced by backlighting element 108 is generally diffuse, with components traveling in different directions. The light from backlighting element 108 is typically passed through a polarizer 110 that blocks light that is not aligned with an axis of polarization of polarizer 110. The light that is aligned with the axis of polarization is allowed to pass through the polarizer 110 for passing through LCD material 102.

The LCD material 102, has electro-optic properties that cause the polarization of light which passes through the LCD material 102 to twist. This twisting may be controlled by applying a voltage waveform to the LCD material 102 for each pixel in an array of pixels. Typically, an electronic circuit that controls the array of pixels operates by accepting a digital control value for each pixel in the array of pixels. The control circuit will apply a voltage waveform to the LCD material 102 for a pixel based on the digital control value for the pixel. Generally, the control circuit is configured so that smaller digital control values result in application of a voltage waveform which causes the LCD material 102 to twist the light in such a way that more of the light it is blocked by the second polarizer 112, causing the pixel to appear darker. Conversely, larger digital control values result in application of a voltage waveform which causes the LCD material 102 to twist the light in such a way that less of the light it is blocked by the second polarizer 112, causing the pixel to appear brighter.

From a power consumption standpoint, LCD backlighting may be far from efficient. For example, while the backlighting element 108 may be set to a bright level to illuminate the LCD material 102, depending on the digital values of pixels to be displayed, the LCD material 102 may be in a twisting configuration which causes a substantial portion of the light passing through the LCD material 102 to be blocked by the second polarizer 112. In particular, cinematic lighting used in movies may result in a relatively dim screen overall, resulting in an inefficient use of backlighting. Thus, LCD backlighting may be particularly inefficient when viewing movies, such as DVD movies, on an LCD screen of a notebook computer. In fact, power consumption of a backlit LCD may account for a large portion of overall power consumption of a notebook computer. The inefficiencies due to LCD backlighting may lead to reduced battery life, which may be particularly problematic, for example, when viewing DVD movies on long airline flights.

Conventional approaches to reducing power consumption of a backlit LCD are typically limited to reducing an amount of backlighting (i.e., dimming). For example, a notebook computer may be configured to dim the backlighting in response to detecting a power supply has been unplugged from an AC power supply and that the notebook is being powered from a battery. However, by dimming the backlighting without adjusting pixel values to compensate for dimming the backlighting, the overall brightness of the LCD, as perceived by a user, may be undesirably reduced.

Accordingly, a need exists for an improved method and apparatus for reducing power of backlit displays while maintaining an overall perceptible level of brightness of the display.

SUMMARY

Aspects of the present invention generally provide methods and apparatus for reducing power of a backlit display by dimming the backlighting and boosting the amplitude of pixel data to be displayed on the display.

According to some aspects of the present invention, the backlighting may be dimmed by a first scale factor and values of pixels to be displayed on the display may be boosted by a second scale factor inversely proportional to the first scale factor. The first and second scale factors may be constant values. Alternatively, either one or both of the first and second scale factors may be determined based on the pixel values for one or more frames to be displayed on the display or that have already been displayed on the display. For example, the first and second scale factors may be determined based maximum pixel values or an average linear amplitude of pixel values for one or more frames of pixels.

One or more other aspects of the present invention may include an integrated circuit for processing graphics. The integrated circuit may include a buffer for receiving a frame of pixels that have been gamma pre-compensated and a circuit coupled with the buffer for transforming values of the pixels from gamma space to linear space. The integrated circuit may be configured to transform the values of pixels from gamma space to linear space by raising the values of the pixels to a power of GAMMA. The integrated circuit may also be configured to receive a value of GAMMA via an application programming interface (API).

BRIEF DESCRIPTION OF THE DRAWINGS

So that the manner in which the above recited features of the present invention can be understood in detail, a more particular description of the invention, briefly summarized above, may be had by reference to aspects, some of which are illustrated in the appended drawings. It is to be noted, however, that the appended drawings illustrate only typical aspects of this invention and are therefore not to be considered limiting of its scope, for the invention may admit to other equally effective aspects.

DETAILED DESCRIPTION

Aspects of the present invention generally provide methods and apparatus for reducing power consumption of backlit displays by reducing an amount (i.e., dimming) of backlighting of the display and adjusting values of pixels to pass more light to compensate for the dimming. The methods and apparatus may be used to reduce the power consumption of any type of backlit displays, including backlit LCD displays, used in a variety of products, such as notebook computers, portable DVD players, personal digital assistants (PDAs), video cameras, and digital cameras.

Figure 1:
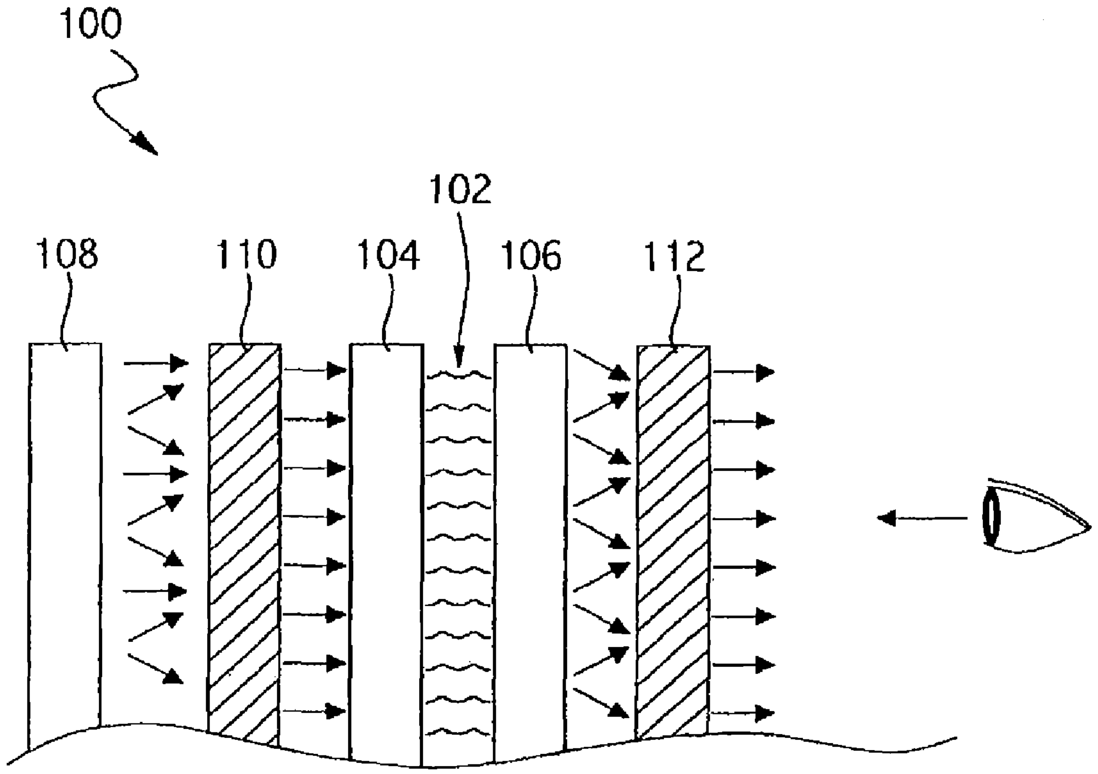
FIG. 1 (Prior Art)
FIG. 1 illustrates an exemplary backlit LCD.
Figure 2:
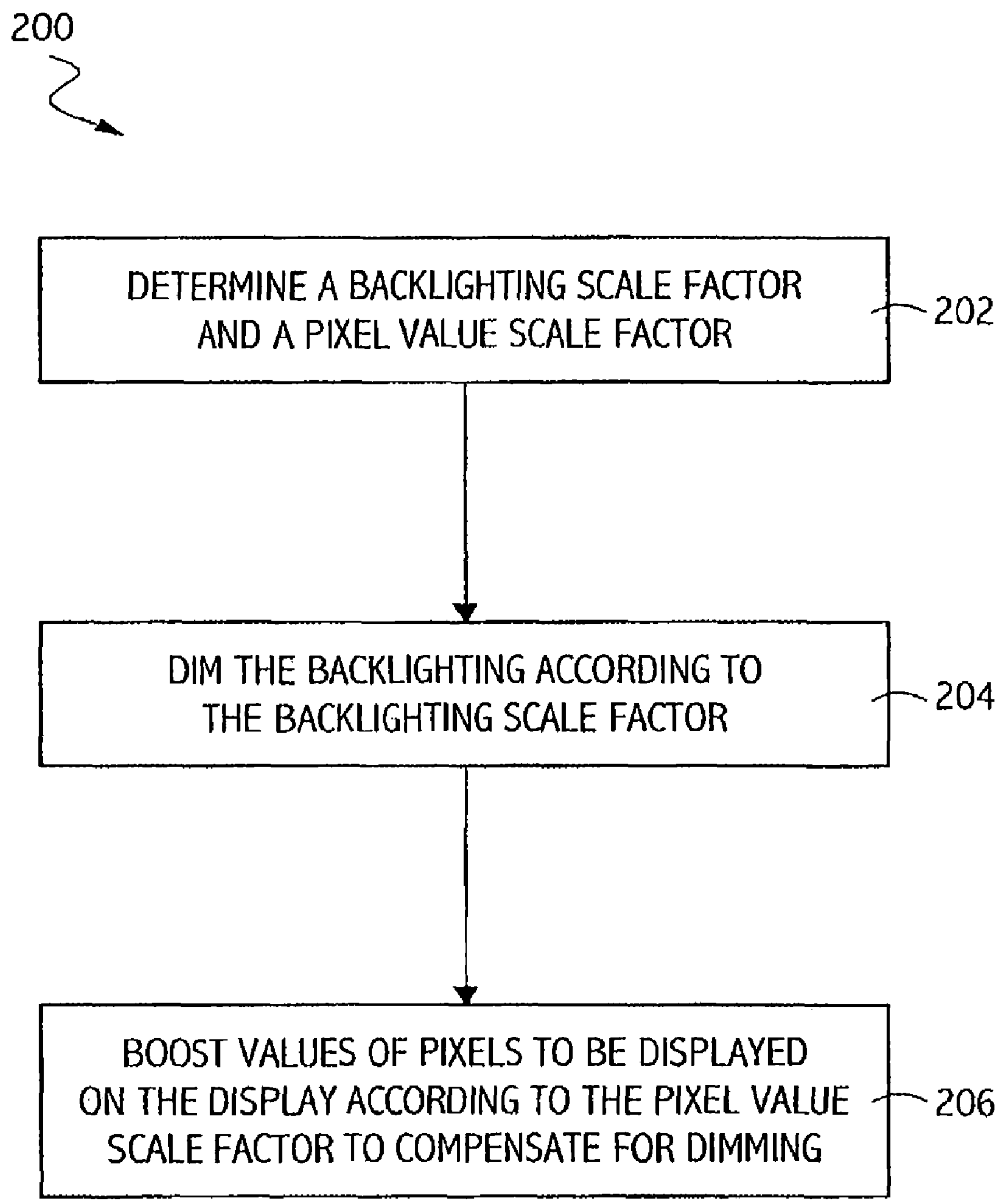
FIG. 2 illustrates exemplary operations for reducing power consumption of a backlit display according aspects of the present invention.

FIG. 2 illustrates exemplary operations for reducing power of a backlit display according to aspects of the present invention. At step 202, a backlighting scale factor and a pixel value scale factor are determined. The backlighting and pixel value scale factors may be chosen according to various methods, and may be constant or variable. For example, backlighting and pixel value scale factors may be determined based on sampled pixel values of one or more frames including the current frame, past frames and/or future frames.

In general, the pixel value scale factor ($SCALE_{PIXEL}$) may be inversely proportional to the backlighting scale factor:

$$SCALE_{PIXEL}=1/SCALE_{BL}.$$

For example, if the backlighting scale factor is between 0 and 1 (e.g., so an amount of backlighting is reduced), the pixel value scale factor may be greater than one (e.g., so a pixel value is boosted). However, according to some aspects of the present invention, pixel values may be decreased to pass more light. Accordingly, a pixel value scale factor may also be less than one.

At step 204, the backlighting is dimmed according to the backlighting scale factor. The backlighting may be dimmed relative to an original (e.g., full scale) amount according to the following equation:

$$BL_{DIM}=BL_{FULL\_SCALE}*SCALE_{BL}$$

where $BL_{FULL\_SCALE}$ is a full scale value of backlighting, The actual mechanism for dimming the backlighting may vary according to different backlighting implementations. For example, a backlighting element may vary an amount of backlighting based on an analog signal. Therefore, backlighting may be dimmed by reducing the analog signal (e.g., from a full scale value). The amount of backlighting may be directly proportional to the analog signal or may have some non-linearities. Non-linearities may be accommodated, for example, via a lookup table, prior to dimming the backlighting.

Figure 3A:
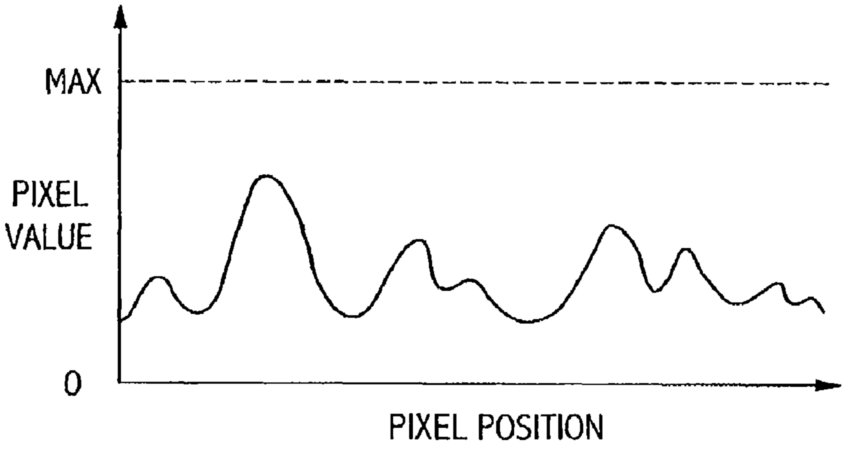
FIGS. 3A-C illustrates an exemplary graph of a frame of pixel values according to aspects of the present invention.
Figure 3B:
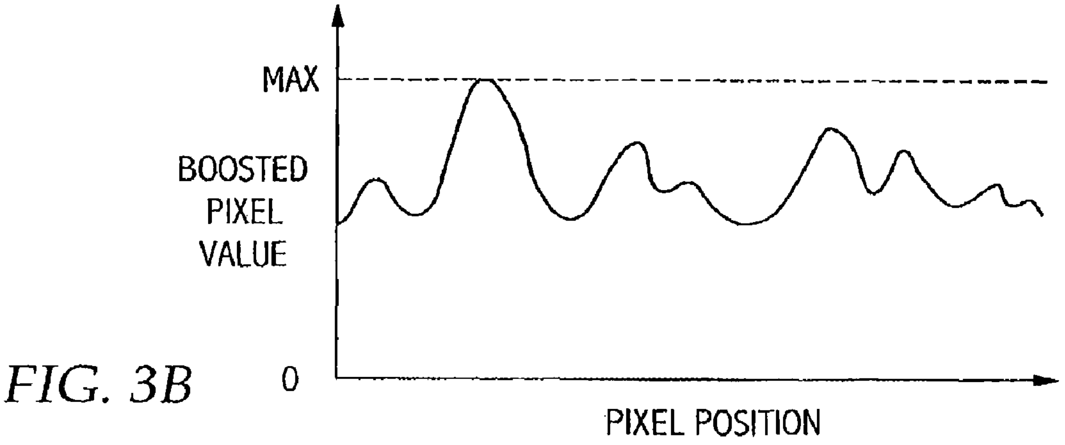
Figure 3C:
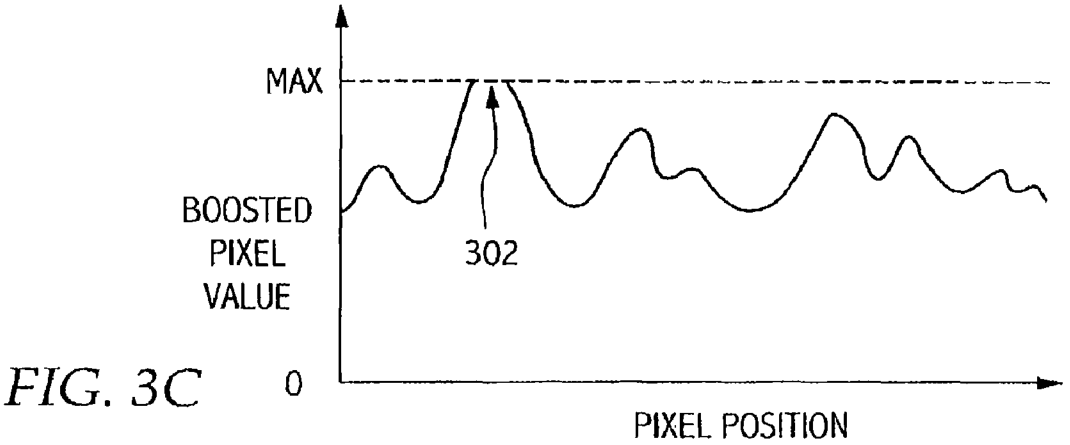

At step 206, the values of pixels to be displayed on the display are boosted according to the pixel scale factor to compensate for the dimming. For example, a single pixel value may be boosted according to the following equation:

$$PV_{BOOST}=PV_{ORIG}*SCALE_{PIXEL}$$

where $PV_{BOOST}$ is the boosted pixel value and $PV_{ORIG}$ is the original (unboosted) pixel value. The effect of boosting pixel values is illustrated in FIGS. 3A-3C, which show a 2 dimensional view of pixel values (vertical-axis) versus pixel position (horizontal axis). For example, the pixel positions may represent screen locations starting from an upper left of the screen and ending on a bottom right of the screen (e.g., moving left to right, top to bottom).

As illustrated, the original pixel values of FIG. 3A may be less than a maximum pixel value represented by a dashed line. FIG. 3B represents the original pixel values of FIG. 3A boosted by a pixel value scale factor greater than one. As illustrated, the boosted pixel values may have a maximum value at or near the maximum pixel value. Because a pixel value is typically limited in size (i.e., to a determined number of bits), if the maximum pixel value is exceeded, the pixel value may be truncated (i.e., wrapped) resulting in a darker pixel. For example, for an 8-bit pixel value (0-255), a value of 256 may be result in a truncated value of 0. Accordingly, as illustrated in FIG. 3C, a range of boosted pixel values 302 may be clamped to a maximum value, to avoid truncating the pixel value.

As used herein, the term pixel value generally refers to a value that is indicative of a brightness of the pixel. Because pixel data may be represented in a variety of color formats, such as RGB (Red, Green, Blue) and YCrCb (luminance-chrominance components), pixel value formats may vary accordingly. Some color formats, may include a separate component corresponding to luminance (e.g., the Y component of YCrCb). For other formats, a luminance value may be a weighted combination of components (e.g., Red, Green, and Blue). Accordingly, boosting pixel values may require boosting a single component (e.g., Y for YCrCb format), or may require boosting multiple components (e.g., red, green, and blue for RGB format). Commonly, a graphical processing system will process video signals in more than one format.

Figure 4:
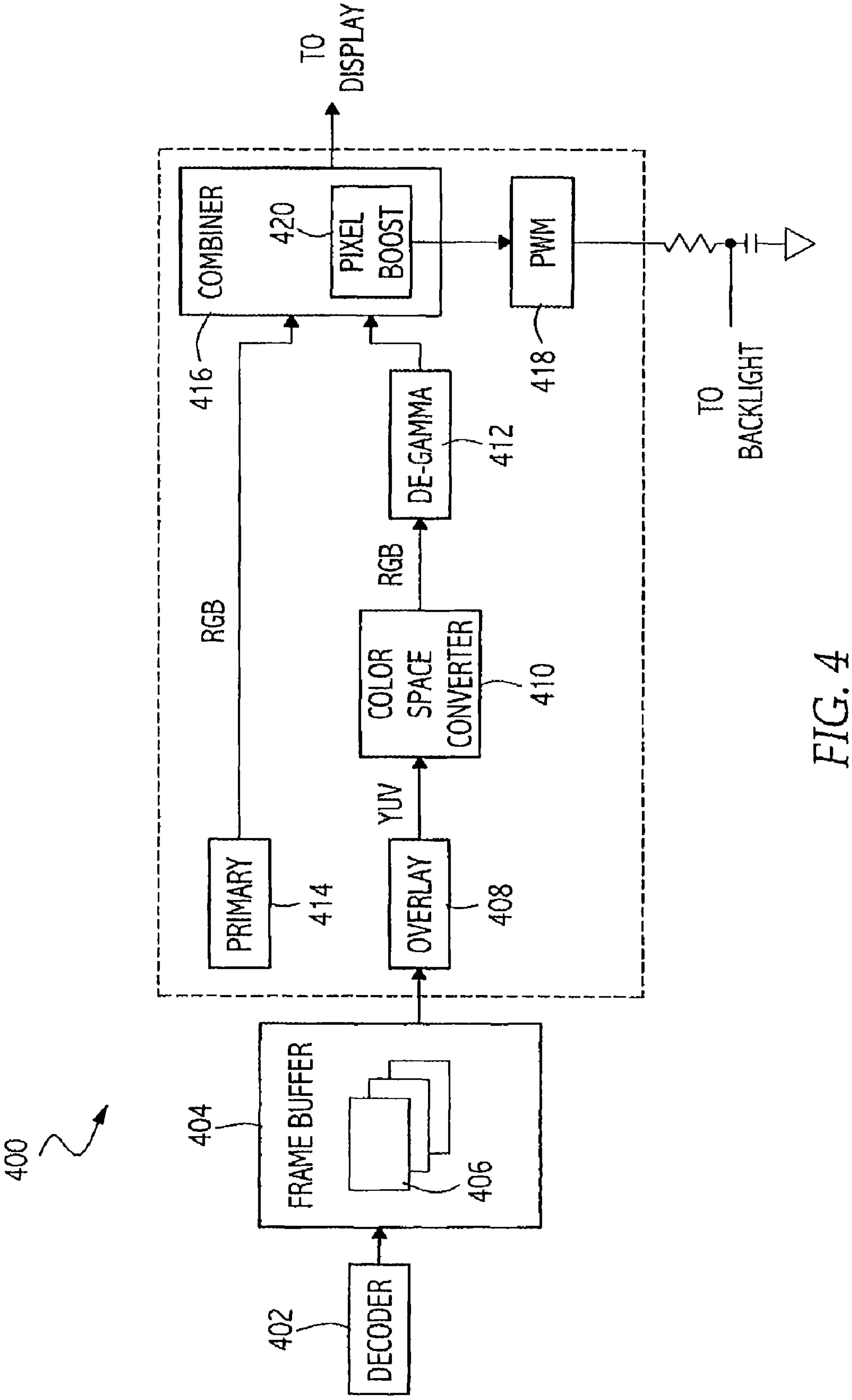
FIG. 4 illustrates an exemplary graphics processing system according to aspects of the present invention.

For example, as illustrated in FIG. 4, a graphical processing system 400 may process an MPEG encoded digital video stream (e.g., from a DVD) in YUV format and a PC video signal in RGB format. Some or all of the elements of system 400 may be separate components or may be combined into a single integrated circuit (IC). For example, elements 408-420 may be combined in a single integrated circuit 430.

A decoder 402 may receive an MPEG encoded video stream and decode the video stream into individual frames 406 sent to a frame buffer 404. The DVD video stream may be displayed in an overlay window on top of a primary (e.g., a standard PC desktop) window. Accordingly, individual frames 406 of the video stream may be sent to an overlay buffer 408, where they may be later combined with a primary frame from a primary buffer 414 via a combiner 416.

Because the MPEG algorithm operates on images represented in YUV color space, the system 400 may also include a color space converter 410 to convert a decoded image from YUV color space to RGB color space. Further, video signals are commonly gamma pre-compensated to account for non-linearities exhibited in cathode ray tube (CRT) screens. Due to the non-linearities, the screen intensity is not linear with respect to a pixel value input, and may be approximated by the following equation:

$$\text{INTENSITY}=k(\text{PV})^{\psi}$$

where k is a constant, PV is a linear pixel value, and gamma (ψ) is typically between 1.7 and 3.0, depending on the monitor. To compensate for this non-linearity, pixel values are often pre-compensated according to the following equation:

$$\text{PV}_{\psi}=(\text{PV})^{1/\psi}$$

Accordingly, the pixel values for the frames 406 in the frame buffer 404 may be gamma compensated.

However, because digitally controlled LCDs do not typically exhibit the same non-linear behavior associated with CRT monitors, it may be desirable to de-gamma compensate the pixel values before sending them to the display. Accordingly, the graphics processing system 400 may also include a de-gamma module 412 to transform gamma-compensated pixel values back to linear space. The de-gamma module may apply the following equation to pixel values of a frame from the overlay buffer:

$$\text{PV}_{LIN}=(\text{PV}_{\psi})^{\psi}.$$

Subsequently, a linear scale factor may be applied to boost the pixel value, resulting in a desired linear increase in brightness.

Alternatively, pixel values may be boosted prior to performing the de-gamma function on the pixel values. In other words, rather than apply a linear scale factor the scale factor would be gamma compensated:

$$\text{SCALE}_{\psi}=(\text{SCALE}_{LIN})^{1/\psi}$$

Accordingly, whereas the linear scale factor for the pixel values may be inversely proportional to backlighting scale factor, the gamma compensated scale factor may be inversely proportional to the inverse gamma:

$$\text{SCALE}_{\psi}k(1/\text{SCALE}_{BL})^{1/\psi}.$$

An additional step to convert from a linear scale factor to a gamma compensated scale factor may be used with some performance penalty.

The value of gamma used by the de-gamma module 408 may be adjustable. Further, the de-gamma function may be performed in hardware or software. To perform the de-gamma function in hardware, a value for gamma may be passed to the graphics processing system, for example, via an application program interface (API). Alternatively, a constant value of gamma may be used for the de-gamma function. For example, because a default value of 2.2 is often assumed for gamma pre-compensation, the de-gamma module 408 may use a gamma of 2.2. Further, to simplify equations, gamma may be approximated with a constant value of 2 (e.g., hardware and software may have an easier time performing squares and square roots).

Other elements of system 400 may also be implemented as hardware or software. For example, a pixel boost module 420 used to boost pixel values may be part of the combiner 416. The pixel boost module 420 may boost pixel values during a scanout routine, in which pixel values are sent to the display. Alternatively, pixel values may be boosted in software. For example, a software algorithm may boost pixel values of frames 406 in the frame buffer 404.

System 400 may include any suitable means to adjust an amount of backlighting. For example, the system 400 may include a pulse width modulated (PWM) output 418. The amount of backlighting may be adjusted by varying a duty cycle of the PWM output 418. The duty cycle of the PWM output 418 may be varied, for example, via an API call. As illustrated, a simple resistor and capacitor may be coupled with the PWM output 418 to generate an analog signal suitable for a backlighting element. Alternatively, system 400 may generate an analog signal directly.

Figure 5:
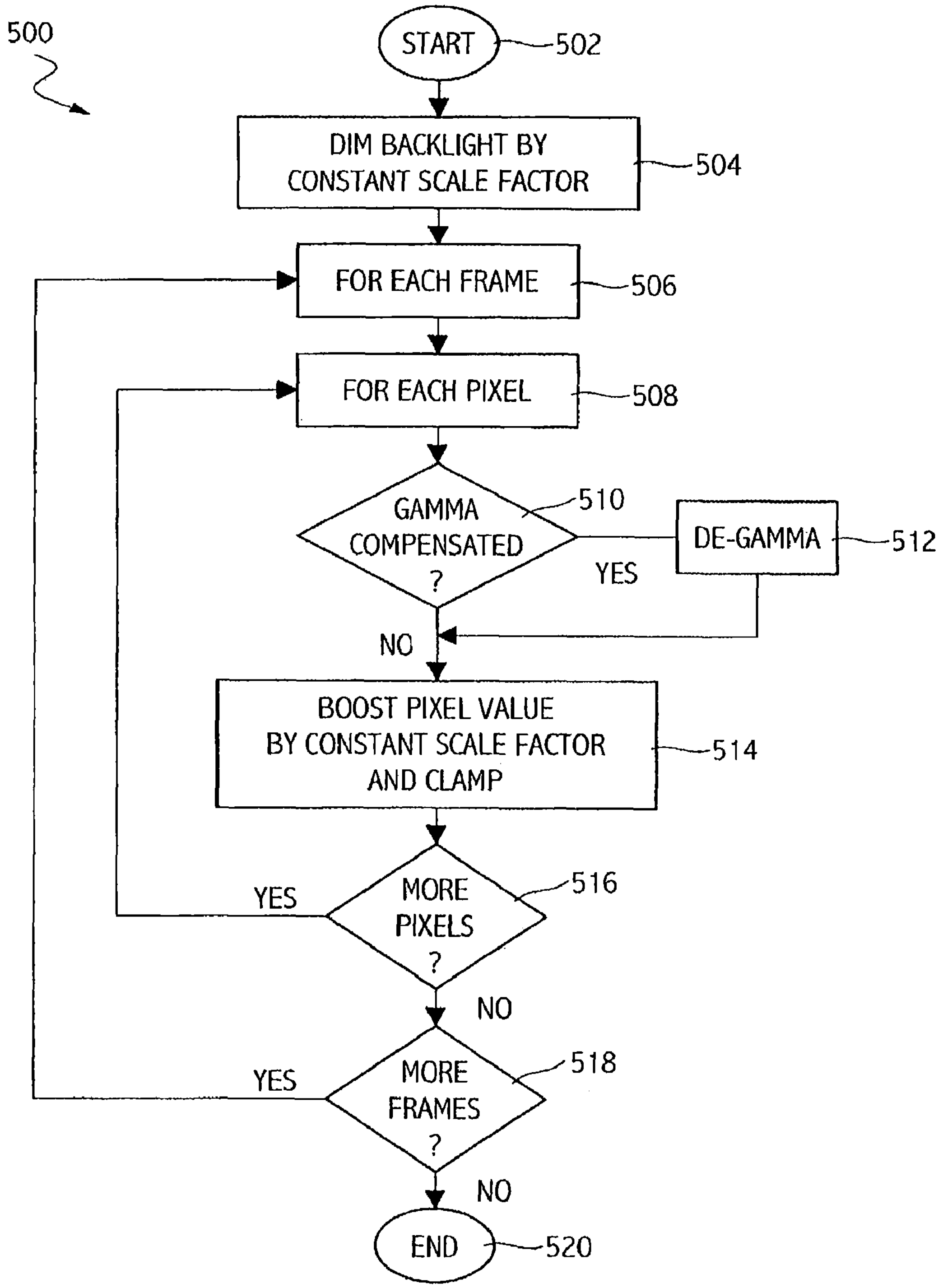
FIG. 5 illustrates exemplary operations for reducing power consumption of a backlit display using constant scale factors for dimming backlighting and boosting pixel values according to aspects of the present invention.

FIGS. 5-9 are flow diagrams illustrating exemplary operations for reducing power of backlit displays according to different aspects of the present invention. For example, FIG. 5 illustrates exemplary operations 500 for reducing power of a backlit display using constant scale factors for dimming backlighting and boosting pixel values. By dimming the backlighting a constant amount, constant power savings may be provided.

Dimming/boosting operations 500 begin at step 502. At step 504, the backlight is dimmed by a constant scale factor. Steps 506-518 represent an outer loop of operations that may be performed for each frame, while steps 508-516 represent an inner loop of operations that may be performed for each pixel in a frame. Depending on the implementation used to perform the operations 500, the operations of steps 508-516 may be performed on multiple pixels in parallel.

At step 510, if the pixel values in the frame have been gamma compensated, the pixel value is de-gamma compensated at step 512. At step 514, the pixel value is boosted by a constant scale factor and clamped (e.g., to avoid screen wrap). As previously described, the operations of de-gamma compensation and boosting the pixel values may be performed in hardware or software and may be performed at various points in processing. For example, pixel values may be boosted during a scanout routine.

At step 516, if there are more pixels, the operations of steps 508-514 are repeated. At step 518, if there are more frames, the operations of steps 506-516 are repeated. Otherwise, operations 500 end at step 520.

While operations 500 work to maintain brightness by boosting the pixels, an overall brightness of the display may be reduced due to clamping of pixel values at step 514. The reduction in brightness due to clamping pixel values may or may not be perceptible, depending on the number of pixel values clamped. However, to compensate for pixel value clamping, the scale factor used for boosting the pixels may be increased responsive to a measured amount of clamping.

Figure 6:
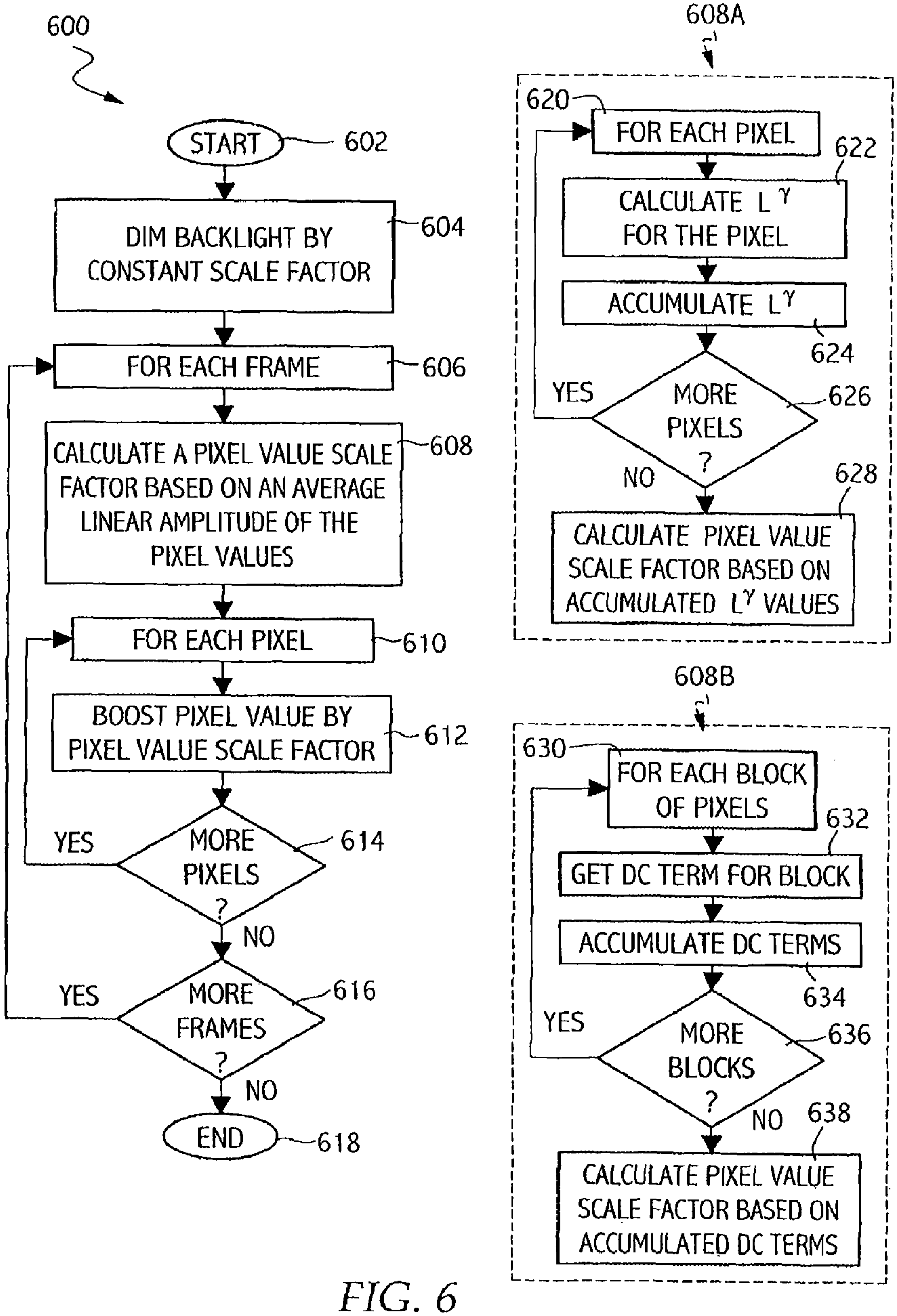
FIG. 6 illustrates exemplary operations for reducing power consumption of a backlit display using data-dependent scale factors for boosting pixel values according to aspects of the present invention.

For example, FIG. 6 illustrates dimming/boosting operations 600 that work to maintain an overall brightness of the display (as before dimming backlighting) by calculating an average linear amplitude for pixel values of a frame. Operations 600 begin at step 602. At step 604, the backlighting is dimmed by a constant scale factor as in FIG. 5.

However, at step 608, a pixel value scale factor is calculated based on an average linear amplitude of the pixel values in the frame. At steps 610-614, each pixel value is boosted using the calculated pixel value scale factor.

Blocks 608A and 608B illustrate exemplary operations for calculating a pixel value scale factor based on an average linear amplitude of the pixel values of a frame using different techniques for calculating the average linear amplitude. As illustrated in block 608A, an average linear amplitude for the frame of pixels may be calculated in the looped operations of steps 620-626. At step 622, a linear amplitude is calculated for each pixel, and at step 624, the calculated linear amplitudes for each pixel are accumulated. The accumulated linear amplitudes for each pixel may be normalized to a value between 0 and 1. At step 628, the pixel value scale factor is then calculated based on the accumulated linear amplitudes for each pixel.

For some aspects, rather than calculate a linear amplitude for each pixel value, linear amplitudes may be calculated for pixel values of a set of sampled pixels. The number and location of the set of sampled pixels may be chosen in an effort to provide an accurate estimate of the average linear amplitude of the frame.

Further, as illustrated in block 608B, rather than calculate a linear average for each pixel, DC terms corresponding to an average linear amplitude for blocks of pixels in a frame may be obtained at step 632 and accumulated at step 634. For example, DC terms for a block of 8×8 pixels may be provided as part of an MPEG encoded video stream. At step 638, the pixel value scale factor is then calculated based on the accumulated DC terms. Because each block may represent several pixels (e.g., 8×8), the operations of block 608B may require less processing time (i.e., fewer times through the loop) time than the operations of block 608A.

The pixel value scale factor may be calculated in an effort to maintain the calculated average linear amplitude for the frame of pixels after dimming the backlighting the same as before dimming. The average linear amplitude after scale may be calculated by the following equation:

$$LA=SCALE_{BL}*LA_{BOOST}$$

where LA represents the average linear amplitude for the pixel values before scale and $LA_{BOOST}$ represents the average linear amplitude of the pixel values after boosting the pixel values with the pixel value scale factor. Due to clamping, the linear amplitude after boosting may be reduced:

$$LA_{BOOST}=SCALE_{PV}*LA-LOSS_{CLAMPING}.$$

Combining the two equations above, absent any loss due to clamping, the average linear amplitude may be calculated by the following equation:

$$LA=SCALE_{BL}*SCALE_{PV}*LA.$$

Accordingly, absent any loss due to clamping, the average linear amplitude may be maintained by setting $SCALE_{PV}$ to 1/SCALEBL. However, if pixel values are clamped, the equation becomes:

$$LA = SCALE_{BL} * \left[ \sum_{UNCLAMPED} SCALE_{PV} * L^{\psi} + \sum_{CLAMPED} 1 \right]$$

where the first term in brackets represents the linear amplitude of pixel values unclamped after scale (i.e., $L<=1/SCALE_{PV}$), while the second term represents the linear amplitude of pixel values clamped after scale (i.e., $L>1/SCALE_{PV}$), which are clamped to 1.

A loss in linear amplitude due to clamped pixels may be calculated by the following equation:

$$LOSS_{CLAMPING} = \sum_{CLAMPED} (SCALE_{PV} * L^{\psi} - 1)$$

where the first term represents the boosted pixel value before clamping.

Accordingly, the linear amplitude after boost may be rewritten as:

$$LA_{BOOST}-LA-LOSS_{CLAMPING}$$

so the equation for linear amplitude may be rewritten as:

$$LA=SCALE_{BL}*SCALE_{PV}*(LA-LOSS_{CLAMPING})$$

Solving for $SCALE_{PV}$ yields the following equation:

$$SCALE_{PV}=(1/SCALE_{BL})*[LA/(LA-LOSS_{CLAMPING})].$$

Thus, the term in brackets represents an increase in the pixel value scale factor based on the amount of loss due to clamping.

According to other aspects of the present invention, the average linear amplitude for a previous frame may be used to calculate the pixel value scale factor. An advantage to this approach is that the linear amplitudes of pixel values of a current frame may be calculated and accumulated prior to boosting the pixel values (e.g., during scanout), which may avoid an extra loop through the pixels. In other words, the current frame of pixel values may be used to predict the average linear amplitude of the next frame. This approach may produce acceptable results, particularly if there is little variation from frame to frame. As another alternative, an average linear amplitude may be pre-calculated for pixel values of a frame in a frame buffer, prior to displaying the frame.

According to other aspects of the present invention, the pixel value scale factor may be constant and the backlighting scale factor may be calculated in an effort to maintain an average linear amplitude of a frame of pixels. In other words, the backlighting scale factor may be increased (i.e., so the backlighting is brighter) to compensate for a loss in average linear amplitude due to clamping.

Figure 7:
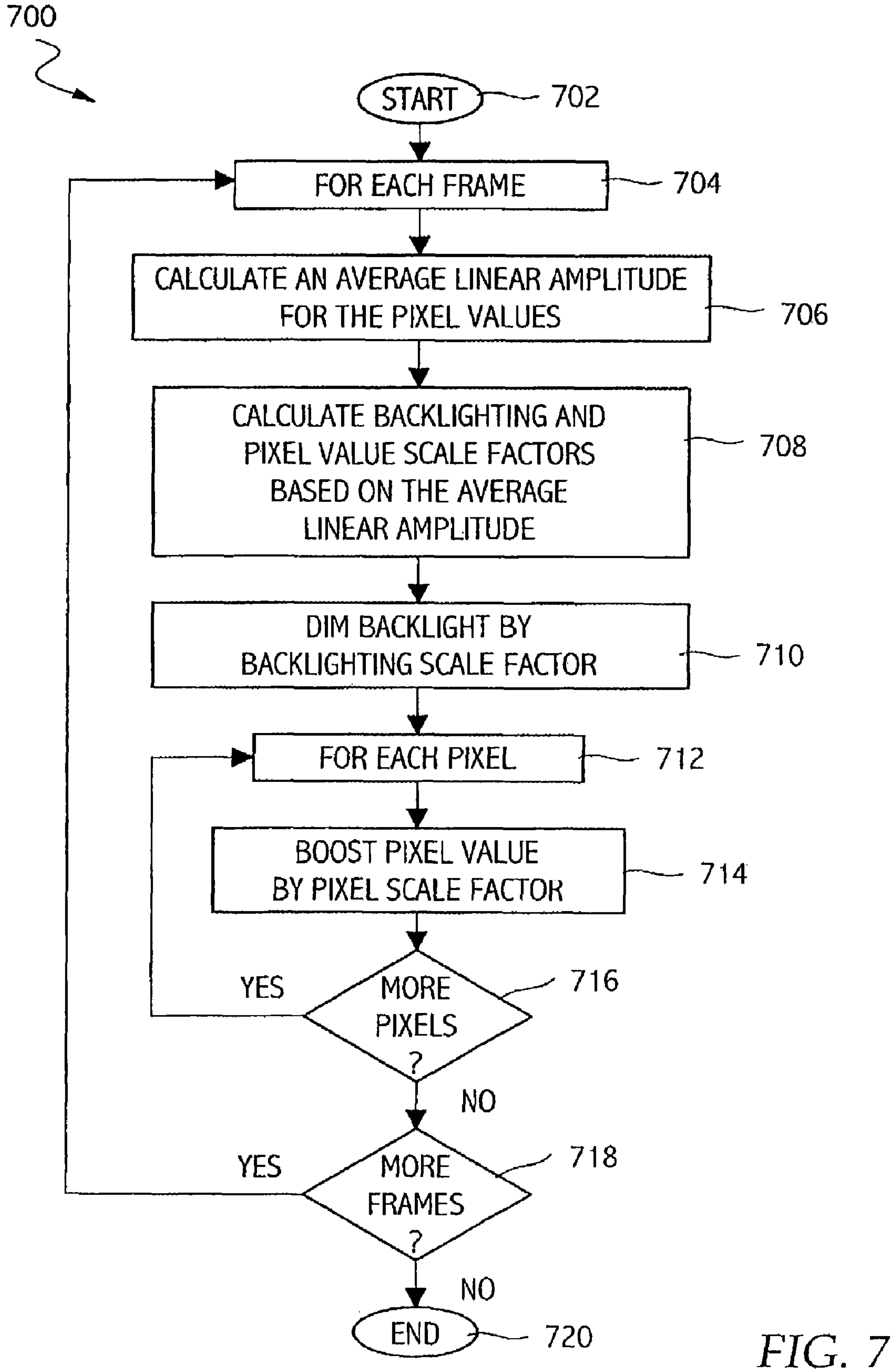
FIG. 7 illustrates exemplary operations for reducing power consumption of a backlit display using data-dependent scale factors for dimming backlighting and boosting pixel values according to aspects of the present invention.

For still other aspects, as illustrated in FIG. 7, the backlighting scale factor and pixel value scale factor may both be calculated based on an average linear amplitude. FIG. 7 illustrates exemplary dimming/boosting operations 700 similar operations 600 of FIG. 6. However, after calculating an average linear amplitude for pixel values at step 706, a backlighting scale factor and a pixel value scale factor may be calculated at step 708 based on the calculated average linear amplitude. Accordingly, because the backlighting scale factor may vary from frame to frame, the operation of dimming the backlighting (step 710) may be moved within a loop of operations 704-718 performed for each frame. At step 706, the average linear amplitude may be calculated using any suitable technique, such as the techniques illustrated in blocks 608A and 608B of FIG. 6.

The backlighting scale factor may calculated, at step 708, using the calculated average linear amplitude. For example, assuming the average linear amplitude is normalized to a value between 0 and 1, the backlighting scale factor may be set to the normalized average linear amplitude:

$$SCALE_{BL}=LA$$

The pixel value scale factor may be calculated, for example, as:

$$SCALE_{PV}=(k/SCALE_{BL})-\epsilon$$

where a factor k may be calculated to account for clamping loss, as previously described, and $\epsilon$ may allow for other adjustments. For example, the pixel value scale factor may be reduced by to allow an amount of headroom in an effort to prevent clipping from one frame to the next. A value of $\epsilon$ may be determined, for example, based on a previous frame of pixel values.

For some aspects scale factors for dimming backlight and boosting pixel values may be based on a maximum value of one or more pixels in a frame, rather than an average linear amplitude. For example, FIG. 8 illustrates dimming/boosting operations 800 which include operations for calculating backlighting and pixel value scale factors based on a maximum pixel values.

Operations 800 begin at step 802. Steps 804-818 represent looped operations performed for each frame. At step 806, pixel values are sampled to determine a maximum pixel value. At step 808, a backlighting scale factor and pixel value scale factor are calculated based on the determined maximum pixel value. At step 810, the backlighting is dimmed using the backlighting scale factor and the pixel values are boosted at steps 812-816.

As illustrated by steps 830-838, each pixel value in a frame may be sampled to determine the maximum pixel value. The backlighting scale factor may then be simply set to the maximum pixel value (normalized between 0 and 1) at step 840. The pixel value scale factor may be set to the inverse of the maximum pixel value at step 842. An advantage to setting the pixel value scale factor to the inverse of the maximum pixel value is that it may guarantee no clamping of pixel values during the scale operations of steps 812-816.

Figure 8:
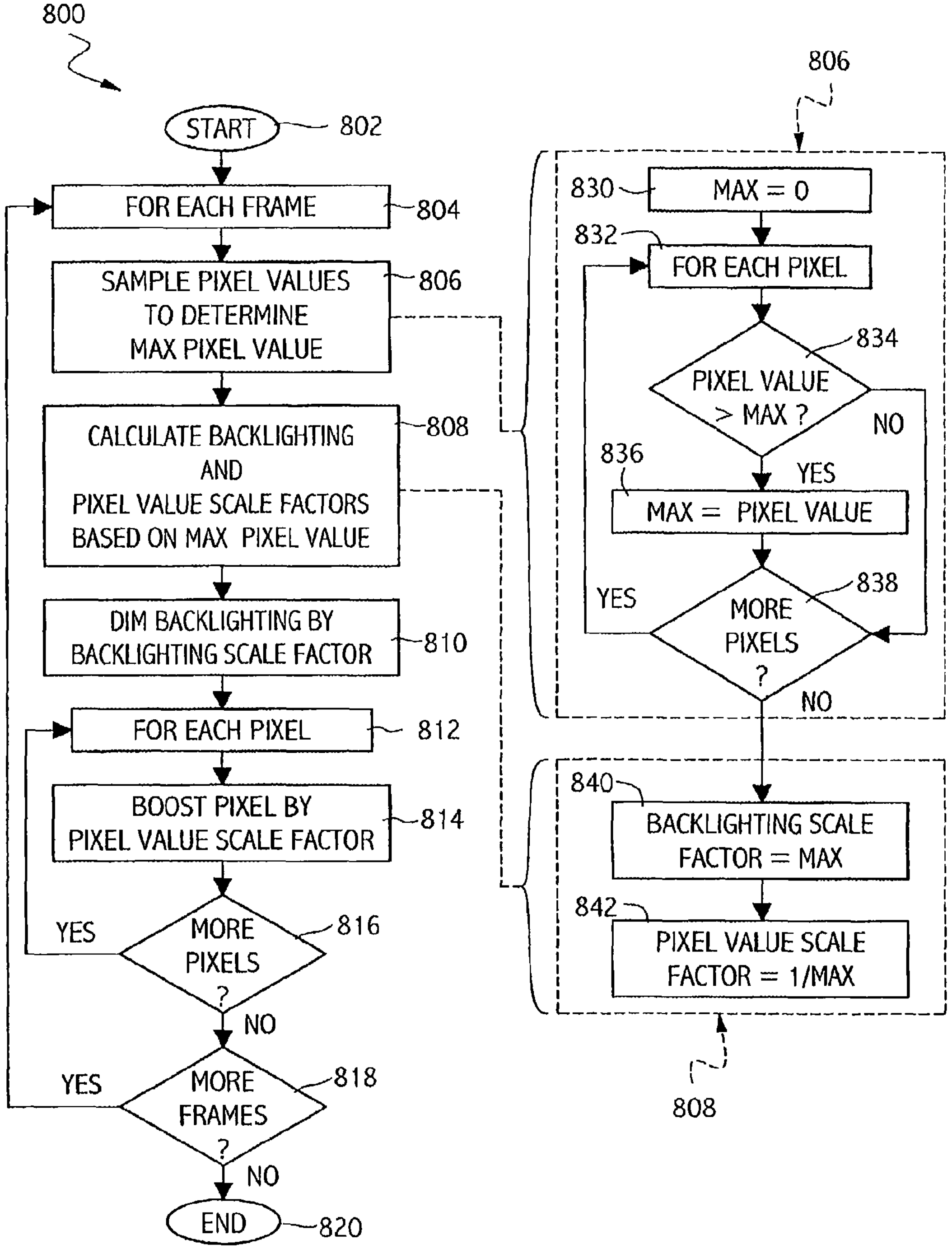
FIG. 8 illustrates exemplary operations for reducing power consumption of a backlit display using data-dependent scale factors for dimming backlighting and boosting pixel values according to aspects of the present invention.

However, because a single pixel value may determine the backlighting scale factor, as illustrated in FIG. 8, less than optimal power savings may result. For example, a single pixel value out of a million (e.g., for a 1280×1024 pixel screen) at the maximum value may determine the scale factor applied to the remaining pixel values. This maximum value may be significantly larger than an average linear amplitude of the entire frame. Clamping the single pixel value (or a small percentage of pixel values) may have little noticeable effect on the overall perceived brightness of the screen.

Therefore, variations of the operations 800 illustrated in FIG. 8 may allow for an amount of clamping by setting the backlighting scale factor to a value less than the maximum pixel value. For example, the variations may include sampling pixel values to determine N maximum pixel values. According to different aspects, all pixel values may be sampled, or a representative group of pixel values may be sampled. Scale factors may then be determined based on the N maximum values. For example, the backlighting scale factor may be set to the Nth maximum value ($MAX_N$):

$$SCALE_{BL}=MAX_N$$

Alternatively, the backlighting scale factor may be set to an average of the N maximum pixel values:

$$SCALE_{BL}=\sum_{n=1}^{N} MAXn/N.$$

The value of N may be varied in either case, for example, to provide a tradeoff between image quality due to clamping and power savings. The pixel value scale factor may be set to an inverse of the backlighting scale factor.

Figure 9:
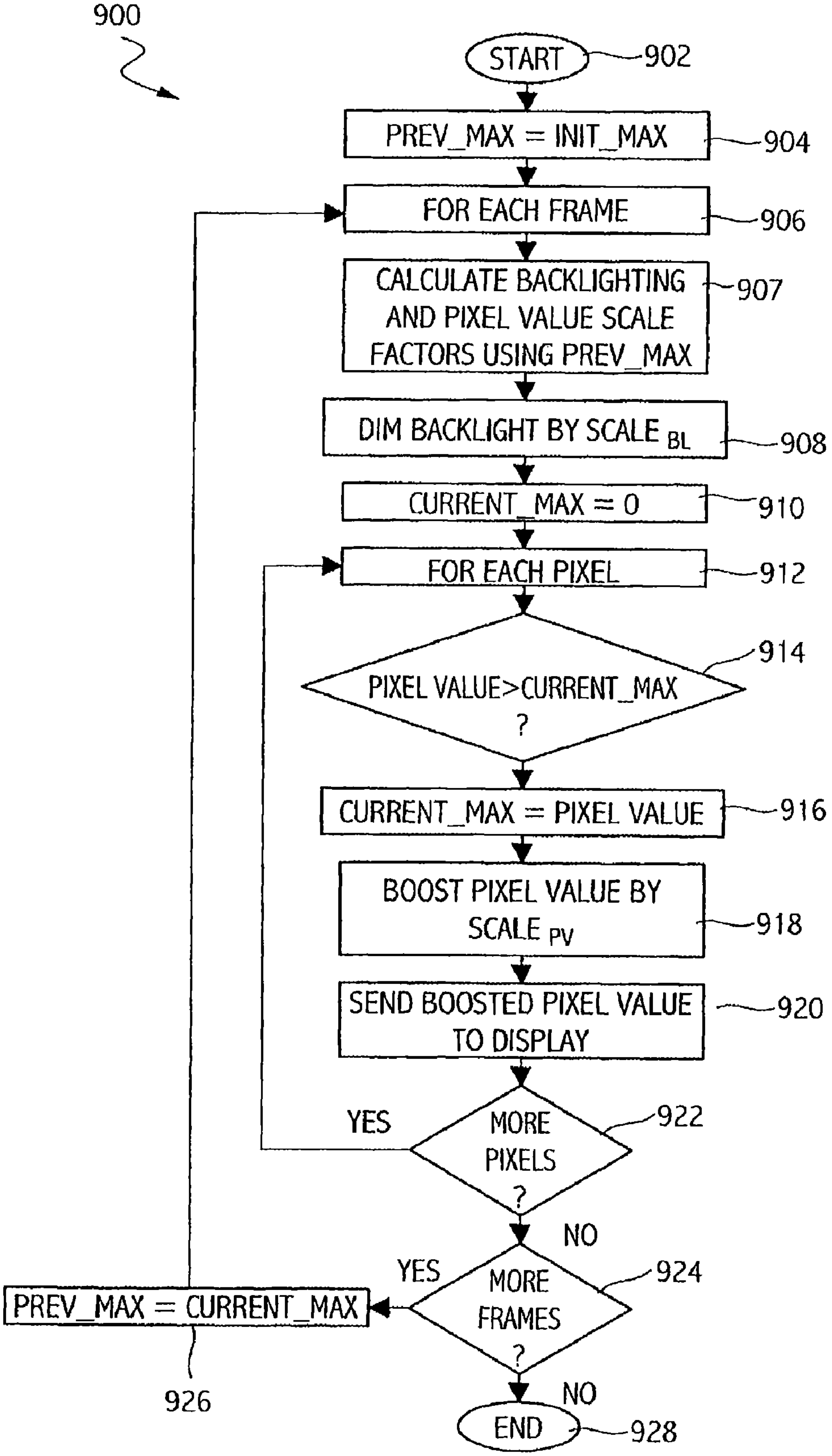
FIG. 9 illustrates exemplary operations for reducing power consumption of a backlit display using historical data-dependent scale factors for dimming backlighting and boosting pixel values according to aspects of the present invention.

As illustrated in FIG. 9, dimming/boosting operations 900 may include operations for calculating backlighting and pixel value scale factors for a current frame based on maximum pixel value from a previous frame. Operations 900 begin at step 902. Because scale factors are determined base on a previous maximum value, for purposes of later calculations, the previous maximum value is set to an initial value at step 904, for example for a first frame. For example, the previous maximum value may be set to a maximum pixel value in an effort to start out with a full amount of backlighting, and no pixel boosting.

Steps 906 through 924 represent looped operations performed for each frame. At step 907, the backlighting and pixel value scale factors are determined using the maximum pixel value of the previous frame. As previously described, assuming a normalized maximum pixel value between 0 and 1, the backlighting and pixel value scale factors may simply be set to the maximum pixel value and the inverse of the maximum pixel value, respectively.

At step 908, the backlighting is dimmed using the backlighting scale factor. Steps 914-924 represent looped operations performed for each pixel in the current frame. At step 914, the current pixel value is compared against the current maximum pixel value for the frame (which is initialized to 0 at step 910). If the current pixel value is greater than the current maximum value, the current maximum value is set to the current pixel value at step 916. At step 918, the current pixel value is boosted using the pixel value scale factor. At step 920, the boosted pixel value is sent to the display.

Operations 900 may use the maximum pixel value from the previous frame to predict the maximum value of the current frame. An advantage to technique may be that the maximum pixel value may be determined during a scanout routine (steps 912-922). Thus, a separate scan through the pixel values to determine the maximum pixel value may be avoided, potentially improving performance.

However, if the current frame includes pixel values above the maximum value of the previous frame, these pixel values may be clamped. For some aspects, the backlighting scale factor may be increased (i.e., less dimming) and the pixel value scale factor decreased to allow an amount of headroom for pixel values above the maximum value of the previous frame, in an effort to reduce clipping. As previously described, backlighting and pixel value scale factors may also be determined based on N sampled maximum pixel values for the previous frame.

Figure 10:
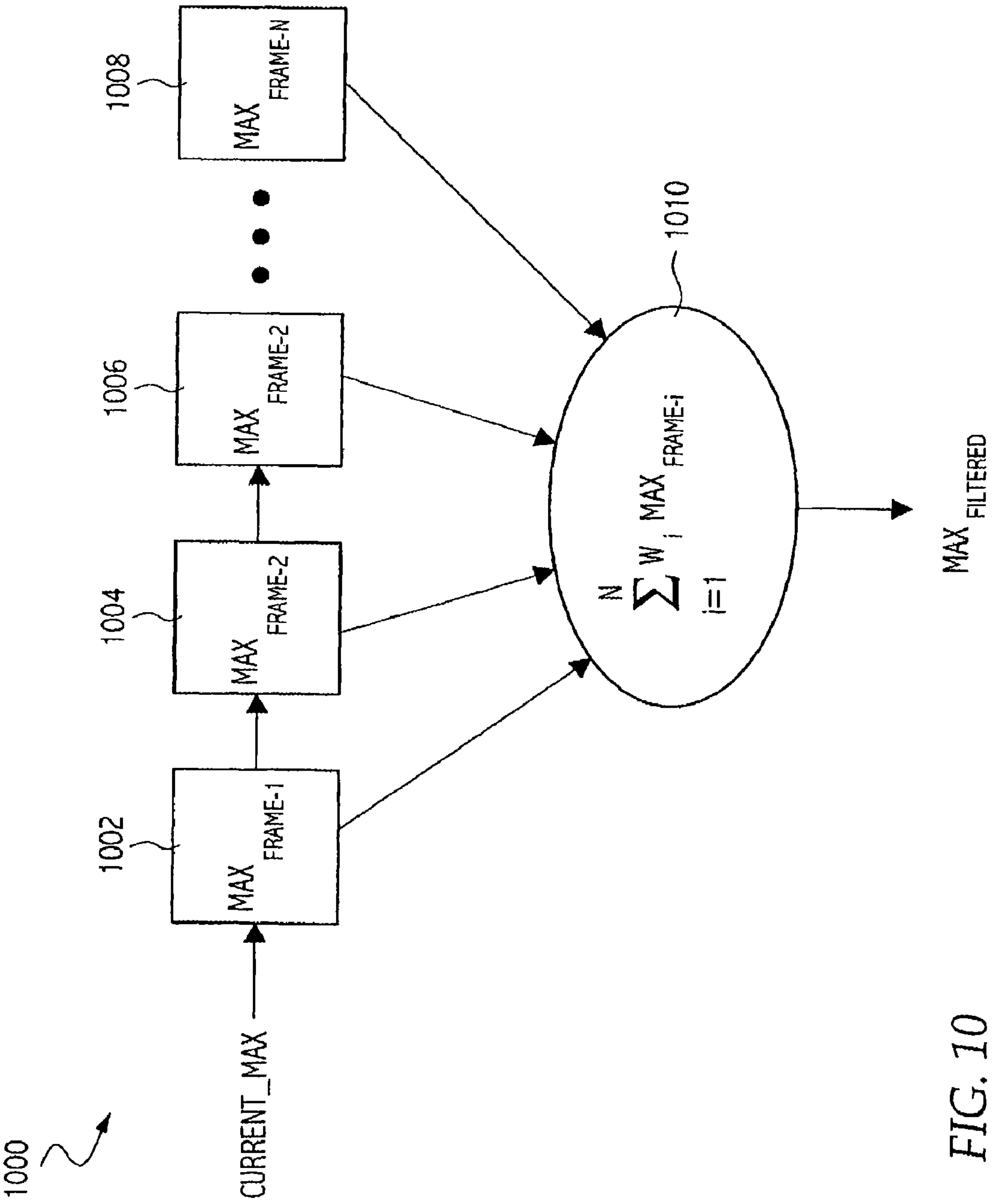
FIG. 10 illustrates an exemplary low pass filter that may be used to generate historical data-dependent scale factors for dimming backlighting and boosting pixel values according to aspects of the present invention.

Further, according to some aspects, maximum pixel values from more than one previous frame may be factored into determining scale factors for backlighting and pixel values. For example, as illustrated in FIG. 10, a low pass filter 1000 may determine scale factors based on maximum values (1002$_1$, 1002$_2$ . . . 1002$_N$) from N previous frames. As illustrated by the block 1010, the N maximum values may be filtered to generate a filtered maximum value ($MAX_{FILTERED}$) for use in generating backlighting and pixel value scale factors. While FIG. 10 illustrates filtering maximum values, other data-dependent parameters from multiple frames may also be filtered, such as linear averages. The filtered linear averages may be used to generate backlighting and pixel value scale factors.

A response time of a backlighting element may be relatively slow when compared to pixel value changes. As a consequence, the backlighting element may not be able to change backlighting fast enough to keep up changes in scaled pixel values. Accordingly, a length of the low pass filter 1000 may be chosen according to a response time of a backlighting element. For example, a backlighting element may take up to 150 ms to respond to change over the entire backlighting range. Assuming a frame rate of 24 fps, the backlighting element may require approximately 4 frames to change the backlighting full scale. Accordingly, a filter length may be set to at least 4, such that the data-dependent parameters (e.g., max values, average linear amplitudes, etc.) of at least four frames are filtered.

Further, according to some aspects, operations may include monitoring the amount of change in a backlighting scale factor from a previous value to a current value based on pixel data (e.g., maximum values or average linear amplitude) of a current frame to determine whether to use the filtered output or not. For example, if the change to the backlighting scale factor based on pixel data from the current frame is small enough that the backlighting may respond fast enough to make the change in one frame, the backlighting scale factor based on pixel data from the current frame value may be used. Alternatively, a backlighting scale factor based on the filtered output may be generated.

Figure 11:
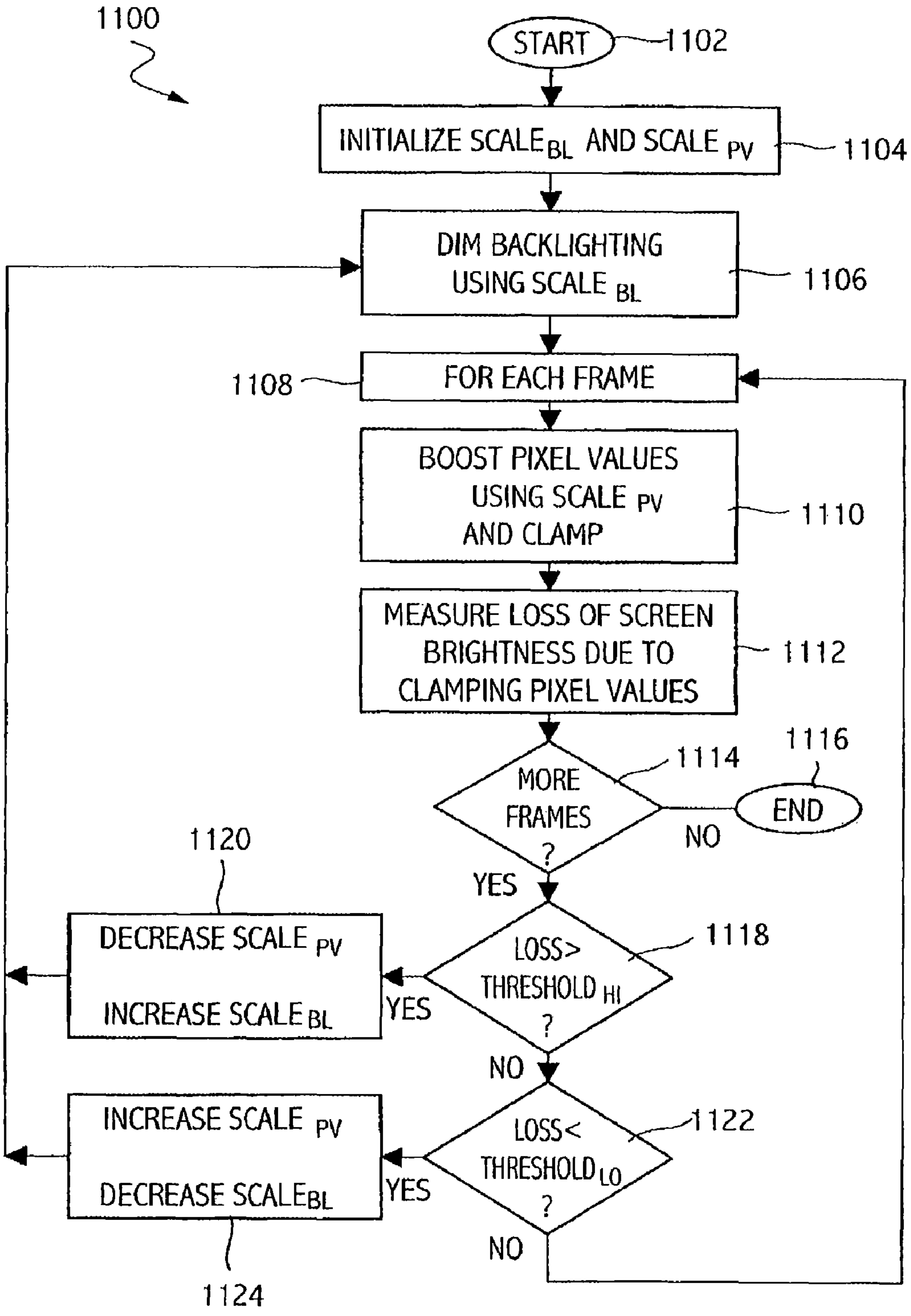
FIG. 11 illustrates exemplary operations for reducing power consumption of a backlit display utilizing hysteresis according to aspects of the present invention.

As previously described, a predetermined amount of loss in screen brightness due to pixel value clamping ("clamping loss") may be an acceptable penalty for a reduction in power savings. According to some aspects of the present invention, backlighting and pixel value scale factors may be adjusted in an attempt to maintain clamping loss within a predetermined range. For example, FIG. 11 illustrates exemplary operations 1100 that work to maintain clamping loss between predetermined high and low threshold values. Operations 1100 begin at step 1102. At step 1104 the backlighting and pixel value scale factors are initialized. For example, both scale factors may be set to one initially (i.e., no dimming, no boost).

At step 1106, the backlighting is dimmed using the backlighting scale factor. At step 1108, for each frame, pixel values are boosted using the pixel value scale factor and clamped at step 1110. At step 1112, the loss of screen brightness due to clamping pixel values is measured. As previously described, loss of screen brightness may be determined by summing an amount of linear amplitude loss due to each clamped pixel value. At step 1114, if there are no more frames, the operations 1100 end at step 1116.

Otherwise, at step 1118, the clamping loss is compared to a high threshold value. If the clamping loss exceeds the high threshold value, the pixel value scale factor is decreased and the backlighting scale factor is increased at step 1120. Decreasing the pixel value scale factor may reduce the amount of clamping, and the associated loss in screen brightness (at the expense of power savings). The pixel value scale factor and backlighting scale factors may be decreased and increased, respectively, using any suitable increments. For example, the increments may represent a fixed percentage of an overall range of the scale factors.

If the clamping loss does not exceed the high threshold value, at step 1122, the clamping loss is compared to the low threshold value. If the clamping loss falls below the low threshold value, the pixel value scale factor is increased and the backlighting scale factor is decreased at step 1124. Decreasing the backlighting scale factor may result in increased power savings.

The high and low thresholds may be adjustable based on a desired result. For example, for aggressive power savings, the high threshold may be set relatively high. Alternatively, for higher quality images, with less clamping, the high threshold may be set relatively low. The low threshold may also be set relatively low to maintain a low pixel value scale factor and minimize clamping. In either case, the difference between the high and low threshold values may be chosen to provide an amount of hysteresis and avoid rapid changes in backlighting, which may be noticeable and distracting to a viewer.

Further, according to some aspects, changes in the scale factors may only be made at scene changes in an effort avoid noticeable changes in brightness. In other words, scene changes typically are typically accompanied by a corresponding change in frame brightness, so any change in brightness due to changing the backlighting dimming and/or boosting the pixel values may be less noticeable. In fact, scene changes may be detected based on a change in average linear amplitude (e.g., above a given threshold) from one frame to another.

While the foregoing is directed to aspects of the present invention, other and further aspects of the invention may be devised without departing from the basic scope thereof, and the scope thereof is determined by the claims that follow. In the claims, the order in which steps and/or operations are listed do not imply any particular order for performing the steps, unless specifically stated in the claim.

We claim:

1. A graphical processing system, comprising:

a frame buffer;

a decoder configured to receive an encoded video stream and to decode the video stream into individual frames sent to the frame buffer;

an overlay buffer configured to receive frames from the frame buffer;

a color space converter configured to receive frames from the overlay buffer and to convert a decoded image from a first color space to a second color space;

a de-gamma module configured to transform gamma-compensated pixel values to linear space;

a combiner unit configured to combine frames from a primary buffer and the de-gamma module for a display, wherein the combiner unit includes a pixel boost module configured to boost pixel values during a scanout routine, in which pixel values are sent to the display.

2. The graphical processing system of claim 1, wherein the pixel boost module is further configured to:

dim backlighting of the display; and increase values of pixels to be displayed on the display to compensate for the dimming.

3. The graphical processing system of claim 1, wherein the display is a liquid crystal display of a laptop computer.

4. The graphical processing system of claim 1, wherein the display is a liquid crystal display of a handheld computer.

5. The graphical processing system of claim 1, wherein the display is a liquid crystal display of a still camera, motion camera, video phone, or cellular phone.

6. The graphical processing system of claim 5, wherein the dimming of backlighting of the display comprises changing a duty cycle of a pulse width modulated output signal.

7. A computing device configured for graphical processing, the computing device comprising:

a memory for storing instructions and a frame buffer; and an integrated circuit configured to execute instructions stored in the memory, the integrated circuit comprising:

an overlay buffer configured to receive frames from the frame buffer, a color space converter configured to receive frames from the overlay buffer and to convert a decoded image from a first color space to a second color space, a de-gamma module configured to transform gamma-compensated pixel values to linear space, and a combiner unit configured to combine frames from a primary buffer and the de-gamma module for a display, wherein the combiner unit includes a pixel boost module configured to boost pixel values during a scanout routine, in which pixel values are sent to the display.

8. The computing device of claim 7, wherein the pixel boost module is further configured to:

dim backlighting of the display; and increase values of pixels to be displayed on the display to compensate for the dimming.

9. The computing device of claim 7, wherein the display is a liquid crystal display of a laptop computer.

10. The computing device of claim 7, wherein the display is a liquid crystal display of a handheld computer.

11. The computing device of claim 7, wherein the display is a liquid crystal display of a still camera, motion camera, video phone, or cellular phone.

12. The computing device of claim 7, wherein the dimming of backlighting of the display comprises changing a duty cycle of a pulse width modulated output signal.

* * * * *